US006690737B1

United States Patent
Kim

(10) Patent No.: US 6,690,737 B1
(45) Date of Patent: Feb. 10, 2004

(54) DEVICE AND METHOD FOR DETERMINING MAXIMUM LIKELIHOOD STATE IN A DECODING DEVICE

(75) Inventor: Min-Goo Kim, Suwon-shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/475,562

(22) Filed: Dec. 30, 1999

(30) Foreign Application Priority Data

Dec. 31, 1998 (KR) .............................................. 98-62713

(51) Int. Cl.⁷ .............................. H04L 23/02; H04L 5/12
(52) U.S. Cl. ....................................... 375/265; 375/262
(58) Field of Search ................................ 375/142, 265, 375/341, 242, 262; 714/795, 794, 796, 786

(56) References Cited

U.S. PATENT DOCUMENTS 5,410,555 A * 4/1995 Itakura et al. .............. 714/795

FOREIGN PATENT DOCUMENTS

| JP | 62-109661 | 5/1987 |
| JP | 05-035460 | 2/1993 |
| JP | 08-051349 | 3/1996 |
| JP | 08-073847 | 3/1996 |

* cited by examiner

Primary Examiner—Stephen Chin
Assistant Examiner—Curtis Odom
(74) Attorney, Agent, or Firm—Dilworth & Barrese, LLP

(57) ABSTRACT

A device for selecting an ML (Maximum Likelihood) state in a decoding device comprising a plurality of cells arranged in a matrix of rows and columns, and a plurality of select lines. In the device, each select line is connected to all cells in a corresponding row, the select lines receive associated path select signals, each cell in a column is connected to cells in an immediately preceding column so that the cell receives a plurality of state values according to a trellis structure of the decoding device, each cell in a first column receives a plurality of state values determined according to the trellis structure of an encoder, said each first column cell selects one of the received state values in response to the select signal to store the selected state value, and cells in the last column output a state value corresponding to the ML state.

13 Claims, 6 Drawing Sheets

DEVICE AND METHOD FOR DETERMINING MAXIMUM LIKELIHOOD STATE IN A DECODING DEVICE

BACKGROUND OF THE INVENTION

1. Field of the Invention

The present invention relates generally to communication systems such as satellite, ISDN, digital cellular, W-CDMA and IMT-2000 communication systems, and in particular, to a device and method for selecting (or determining) a maximum likelihood (ML) state in a decoding device.

2. Description of the Related Art

The present invention is applied to a Viterbi algorithm used for a Viterbi decoder, Viterbi equalizer, ML sequence detector, turbo decoder, SISO (Soft-In, Soft-Out) decoder and trellis coded modulator (TCM).

In particular, the invention is applied to a supplemental channel (or data channel) in an air interface of an IMT-2000 system and to a turbo coder which will be used in a data channel of UMTS (Universal Mobile Telecommunication System) proposed by ETSI (European Telecommunication Standards Institute). In addition, the invention contributes to an increase in the reliability of a digital communication system, and in particular, to a performance improvement of existing and future digital mobile communication systems.

Conventionally, a trace-back method is used to determine ML states. This method calculates a vector for minimizing the Euclidean distance between a symbol vector $R=(r1,r2,\ldots,rn)$ received during Viterbi decoding and a code vector $C=(c1,c2,\ldots,cn)$ on an encoder trellis, and then outputs an ML state at a corresponding branch at a desired time while tracing back the states on a trellis path, along which the code vector progresses, beginning at the present time. For example, in order to determine an ML state at a present time k, it is necessary to perform an ACS (Add-Compare-Select) operation and a path selection of the Viterbi decoder until a time which is a time (k+W) ahead of the present time, and trace back an ML path by W from the time (k+W). Here, W is a predetermined size and has a value of W>5 m, where m is a memory size (or capacity) of a convolutional coder. Herein, W is a sliding window, and a memory size of m is 8 in the case of the constraint length K=9.

For a high-speed Viterbi decoder, the trace-back method has some disadvantages. Using the trace-back method causes a considerable delay. For example, when a decoding depth or sliding window depth is W, it is necessary to perform a back search by W in order to select an ML state. Therefore, when the total frame size is FL, a processing delay required for the whole ML state search increases by W×(FL−W). It is noted that the processing delay increases considerably, as compared with a processing delay L occurring when the Viterbi decoder performs the trace-back operation only once (i.e., when the Viterbi decoder operates in a frame mode (W=FL)). More accurately, the delay increases by (W(FL−W)−FL). For example, for FL=2000 and W=60, the processing delay for ML state search in the frame mode is 2000, which identical to FL. However, in the sliding window mode, the processing delay for ML state search is W(FL−W)=60(2000−60)=116400, which is 58.2 times the processing delay in the frame mode. That is, it is noted that the processing delay increases by about W times. Therefore, the prior art requires many internal operations resulting in processing delays when searching an ML state.

For a turbo decoder, there are various proposed decoders such as a MAP (Maximum A Posteriori probability) decoder and a SOVA (Soft Output Viterbi Algorithm) decoder. The SOVA decoder requires an algorithm for searching the ML state in order to improve performance. A low-speed turbo coder can be implemented by the trace-back method stated above. However, since an actual complexity of the turbo decoder is very high, resulting in processing delays, the ML state search of the trace-back method can be performed only at relatively low data rate.

In summation, the prior art has the following disadvantages.

First, the trace-back method has a considerable delay in determining the ML state. For example, when the decoding depth (or sliding window depth) is W, it is necessary to perform a back-search by W in order to select an ML state at every trace-back process. Therefore, when the whole frame size is FL, the processing delay required for the whole ML state search considerably increases by W(FL−W).

Second, when a SOVA decoder is used to implement a turbo decoder, an algorithm for searching an ML state is essentially required to improve performance. However, the trace-back method is undesirable due to its processing delay problem.

Therefore, there is a demand for a new ML state determining method having the reduced processing delay. Thus, the present invention proposes a new ML state determining method, in which the above stated conditions and the hardware implementation complexity are taken into consideration.

SUMMARY OF THE INVENTION

It is, therefore, an object of the present invention to provide a device and method for determining an ML state in a decoding device using a trellis decoding method.

It is another object of the present invention to provide a device and method for determining an ML state in a SOVA decoder.

To achieve the above objects, there is provided a device for selecting an ML (Maximum Likelihood) state comprising: a plurality of cells arranged in a matrix of rows and columns; and a plurality of select lines, wherein each select line is connected to all cells in a corresponding row, the select lines receive associated path select signals, each cell in a column is connected to cells in an immediately preceding column so that the cell receives a plurality of state values according to a trellis structure of the decoding device, each cell in a first column receives a plurality of state values determined according to a trellis structure of an encoder, said each first column cell selects one of the received state values in response to the select signal to store the selected state value, and cells in a last column output a state value corresponding to the ML state.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail to avoid obscuring the invention in unnecessary detail.

At present, for a turbo decoder, various decoders have been proposed, such as a MAP decoder and a SOVA decoder. The SOVA decoder requires an algorithm for an ML state search in order to improve decoder performance. Hereinafter, the invention will be described with reference to a register exchange cell block which searches an ML state using a plurality of cells arranged in the matrix of rows and columns. Here, the cells are memories for storing state values on the trellis.

The embodiment comprises a path selection block and a register exchange cell block. The path selection block calculates a branch metric BM in every possible state from the symbols received from the channel, and provides the register exchange cell block with a cell of the path select signal for one of the two signals input to each register exchange cell. The register exchange cell block updates state values stored in the cells by inter-row exchanging according to the path select signal. When this exchange process is performed for a predetermined time, the state values stored in the same column will have the same value. Here, the same state value is identical to an ML state acquired in a trellis decoder.

As used herein, the term "register exchange cell block" is used interchangeably with the term "ML state selector".

Figure 1:
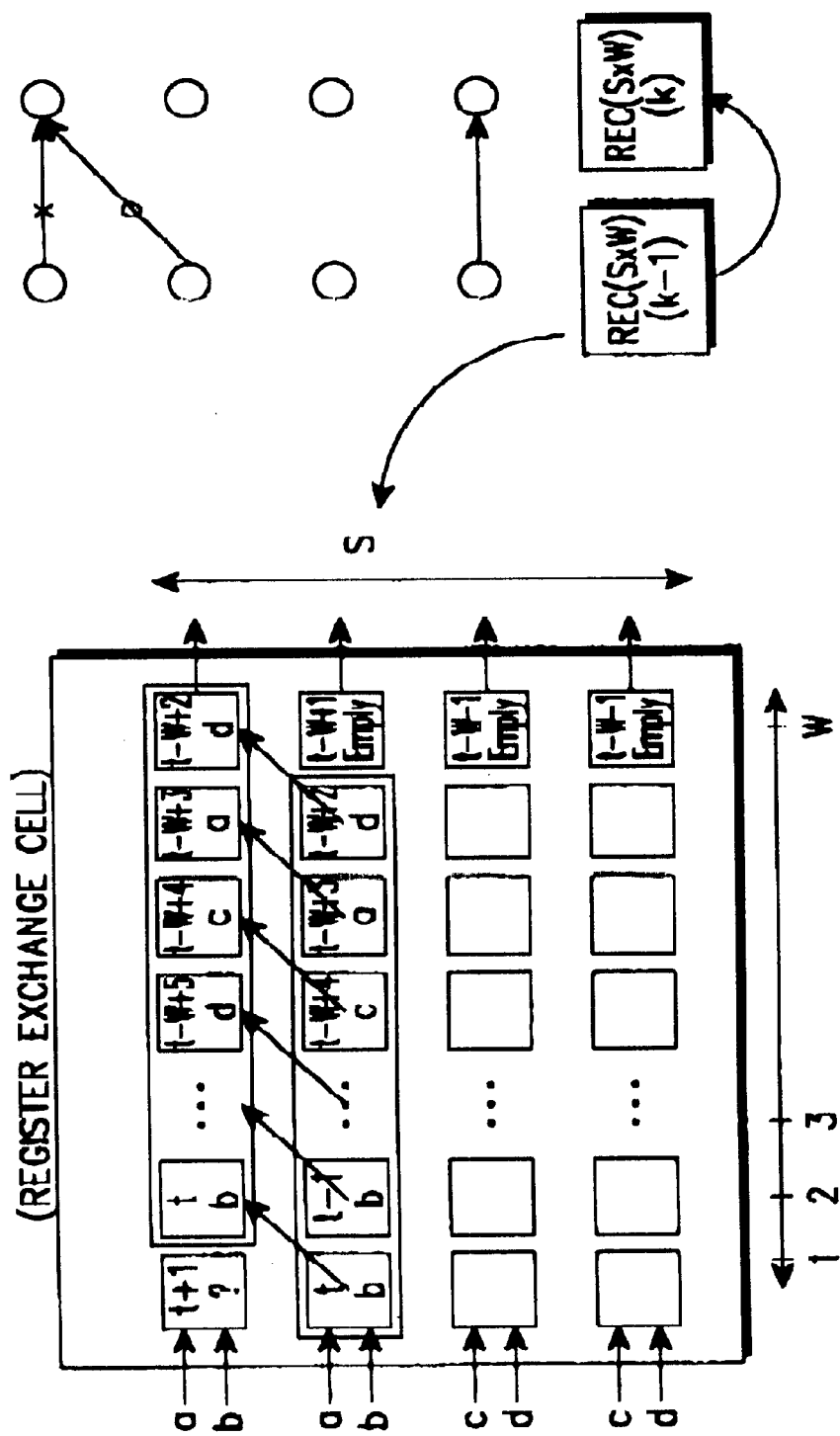
FIG. 1 is a diagram illustrating a register exchange method according to an embodiment of the present invention.

FIG. 1 shows a register exchange cell block according to an embodiment of the present invention. Referring to FIG. 1, the register exchange cell block includes a plurality of cells arranged in the matrix of rows and columns. The number of rows is identical to a state number (S=4) of the trellis, and the number of columns is identical to the size (W) of a given window. Each cell is a memory for storing a state value of the trellis. A combination of the cells in each row will be referred to as a path memory. Therefore, when the state number is S=4 and the size of the path memory corresponding to each state is W, the overall size of the register exchange cell block becomes W×S(=4).

If it is assumed that a lower path out of two paths input to a state 0 at a time t is determined as an ML path (where in the trellis, the uppermost state is 0 and the next states are 1, 2 and 3 in sequence), this means that a state1 cell at time t+1 transfers the contents of data selected by the previous ML path determination to a state '0' cell at the time t in the register exchange cell. That is, it means that in the register exchange cell block, data bits stored in the path memory in the second row are all transferred to the path memory in the first row except the left most cell. The left most cell in the first row select lower path signal b is predetermined according to the trelis structure. Therefore, as illustrated, the data bits in the second row are all transferred to the first row. The last selected content is stored in the leftmost cell in the first row. For example, information stored in the leftmost cell in the first row at the time k is 'b', since the lower path is selected in the trellis shown on the right. The value stored in the last cell of the first line is the same as the value stored in another line of the last column in the case where the size of the window is large enough. The value is the ML state index at t−W+2.

Figure 2:
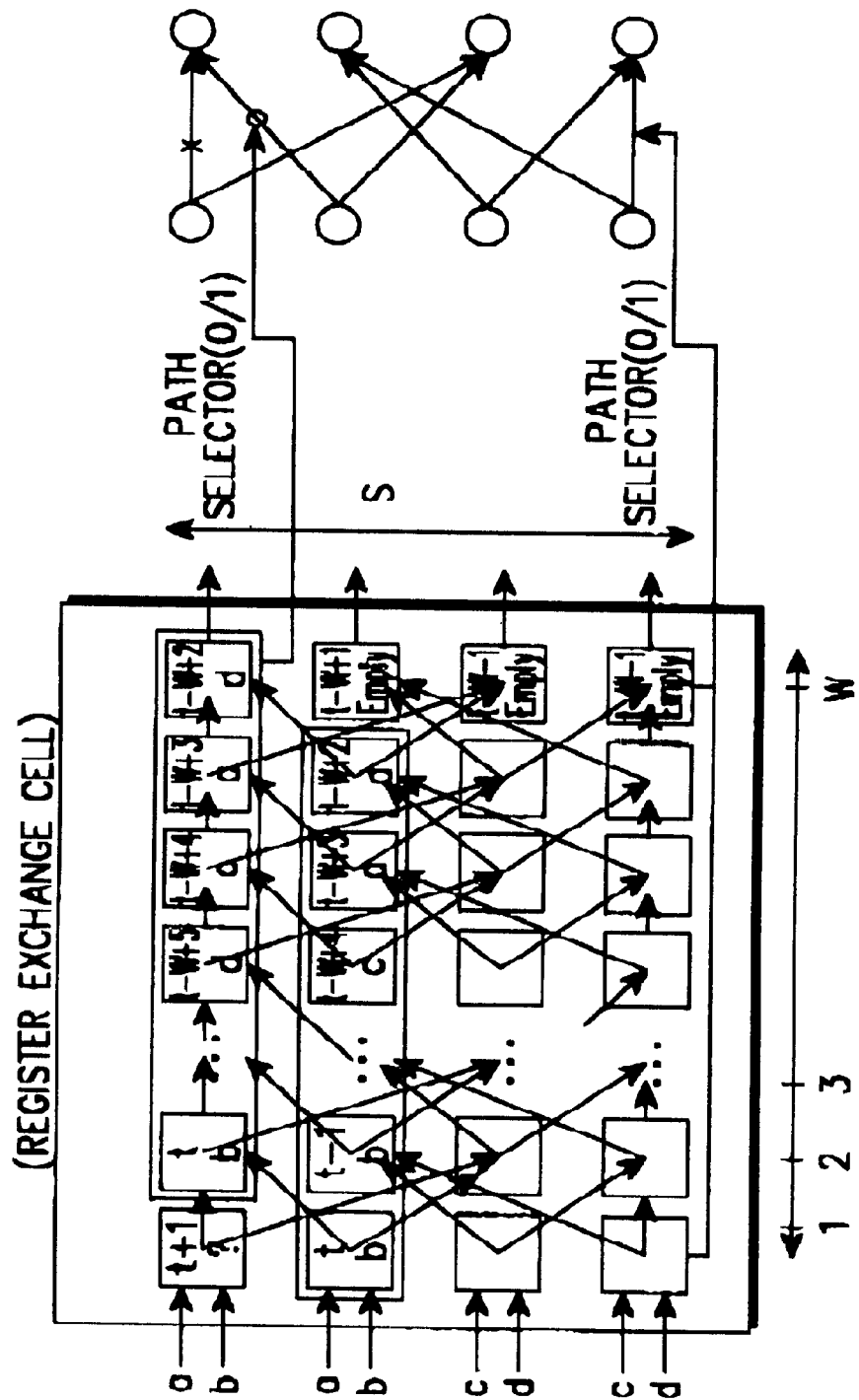
FIG. 2 is a diagram illustrating a register exchange cell according to an embodiment of the present invention.

FIG. 2 shows the register exchange cell block according to an embodiment of the present invention, in which the cells existing between the first column and the last column are connected to two cells in the column immediately preceding such that they receive two state values according to a given trellis structure. In FIG. 2, the right hand side shows a trellis of state number S=4, and the left hand side shows the register exchange cell block connected such that each cell receives a plurality of data bits via the above trellis. In other words, in any case, the register exchange cell block can be implemented, when a trellis is given.

Referring to FIG. 2, when an upper path is selected from the paths input to the state '0' at a given time k, the register exchange cell block shifts right data bits in the cells in the first row by one cell, and stores 'a' in the leftmost cell in the first row. Otherwise, when the lower path is selected from the paths input to the state '0', the register exchange cell block transfers the data bits in the cells in the second row to the first row and stores 'b' in the leftmost cell in the first row.

Meanwhile, when an upper path is selected from the paths input to the state '1', the register exchange cell block transfers data bits in the cells in the third row to the second row, and stores 'a' in the leftmost cell in the second row. Otherwise, when the lower path is selected, the register exchange cell block transfers the data bits in the cells in the fourth row to the second row, and stores 'b' in the leftmost cell in the second row.

Further, when an upper path is selected from the paths input to the state '2', the register exchange cell block transfers data bits in the cells in the first row to the third row, and stores 'c' in the leftmost cell in the third row. Otherwise, when the lower path is selected from the paths input to the state '2', the register exchange cell block transfers the data bits in the cells in the second row to the third row, and stores 'd' in the leftmost cell in the third row.

In addition, when an upper path is selected from the paths input to the state '3', the register exchange cell block transfers data bits in the cells in the third row to the fourth row, and stores 'c' in the leftmost cell in the fourth row. Otherwise, when the lower path is selected from the paths input to the state '3', the register exchange cell block shifts right the data bits in the cells in the fourth row by one cell, and stores 'd' in the leftmost cell in the fourth row. The above path selection is performed through branch and path metric calculation in the path selection block. Further, each cell receiving two data bits, is comprised of a 2×1 multiplexer for selecting one of the two input data bits. The path selection block provides the multiplexer with a control signal (or path select signal (0 or 1)).

Now, a description will be made of an ML state determining method performed in the register exchange cell block.

In each state, the data stored in the cells is updated in response to the path select signal provided from the path selection block. Here, the data stored in the cells is regardless of a format. In other words, although mapping is performed on the data expressed as {a,b,c,d}, it is regardless of the ML path, and only the output value corresponding to the ML path is mapped differently. Therefore, if the respective state indexes 0, 1, 2 and 3 of the trellis are matched to {a,b,c,d}, respectively, the values output from the register exchange cell block will become the state index values for the ML path. Here, when symbols are matched to the data expressed as {a,b,c,d}, the register exchange cell block becomes a Viterbi decoder. However, the embodiment of the invention maps the state index values of the trellis for the data expressed as {a,b,c,d}, and updates the contents stored in the respective cells according to the path select signal, thereby determining the ML state.

Figure 3:
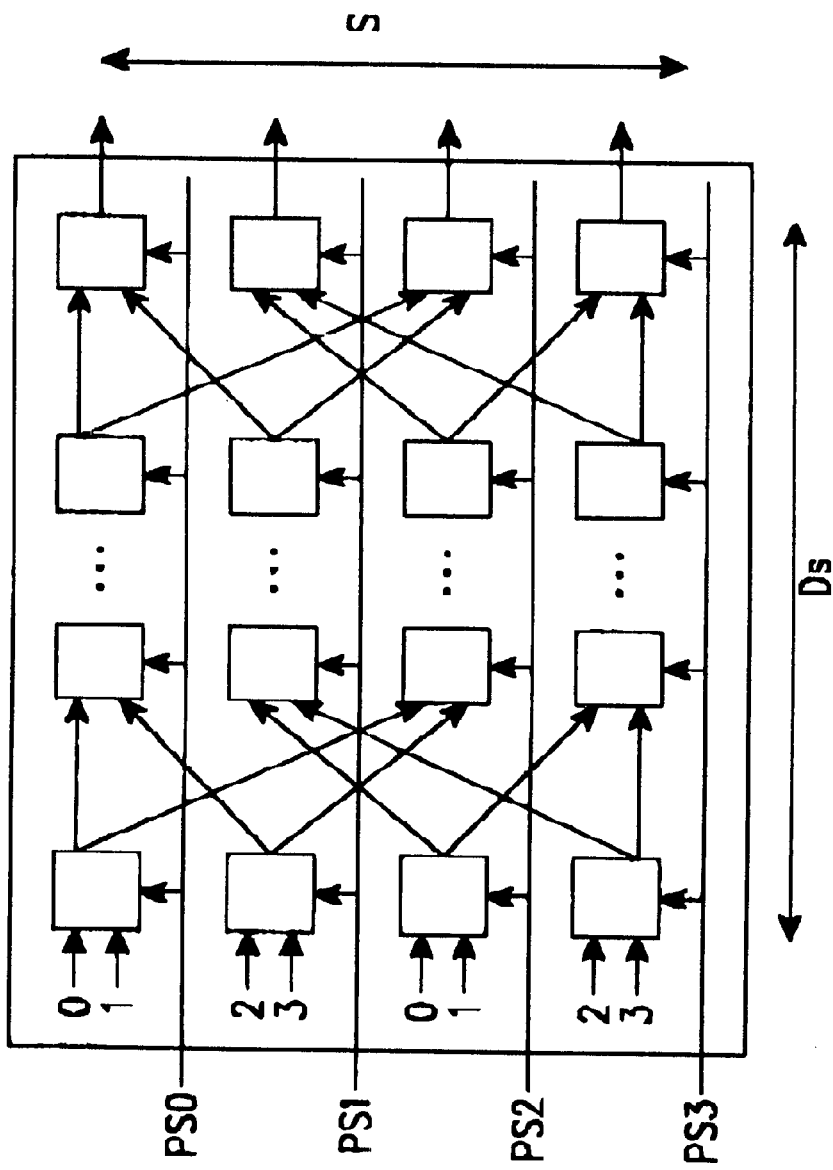
FIG. 3 is a diagram illustrating an ML state selector according to an embodiment of the present invention.

FIG. 3 shows a detailed structure of the register exchange cell block according to an embodiment of the present invention. The register exchange cell block includes a plurality of cells arranged in the matrix of rows and columns, and a plurality of path select lines each connected to the cells in the corresponding rows. The path select lines are connected to the path selection block, and provide the path select signals output from the path selection block to the respective cells.

Referring to FIG. 3, the path selection block calculates a branch metric from the received vector for each state at time k, as is done in the Viterbi decoder. Further, the path selection block determines a path metric from the branch metric, and determines one path in each state through an ACS operation. Then, the path selection block outputs the path select signal to the register exchange cell block through the determined path. For example, for the state number S=4, the path selection block outputs 4 bits in parallel, as illustrated. The register exchange cell block then updates the cell contents according to the path select signal. For example, when the path select signal is '0000', the state index values stored in the respective cells in the first row are shifted right by one cell according to a first select signal PS0='0'; the state index values stored in the respective cells in the third row are transferred to the next cell of the second row according to a second select signal PS1='0'; the state index values stored in the respective cells in the first row are transferred to the next cell of the third row according to a third select signal PS2='0'; and the state index values stored in the respective cells in the third row are transferred to the next cell of the fourth row according to a fourth select signal PS3='0'.

Figure 4:
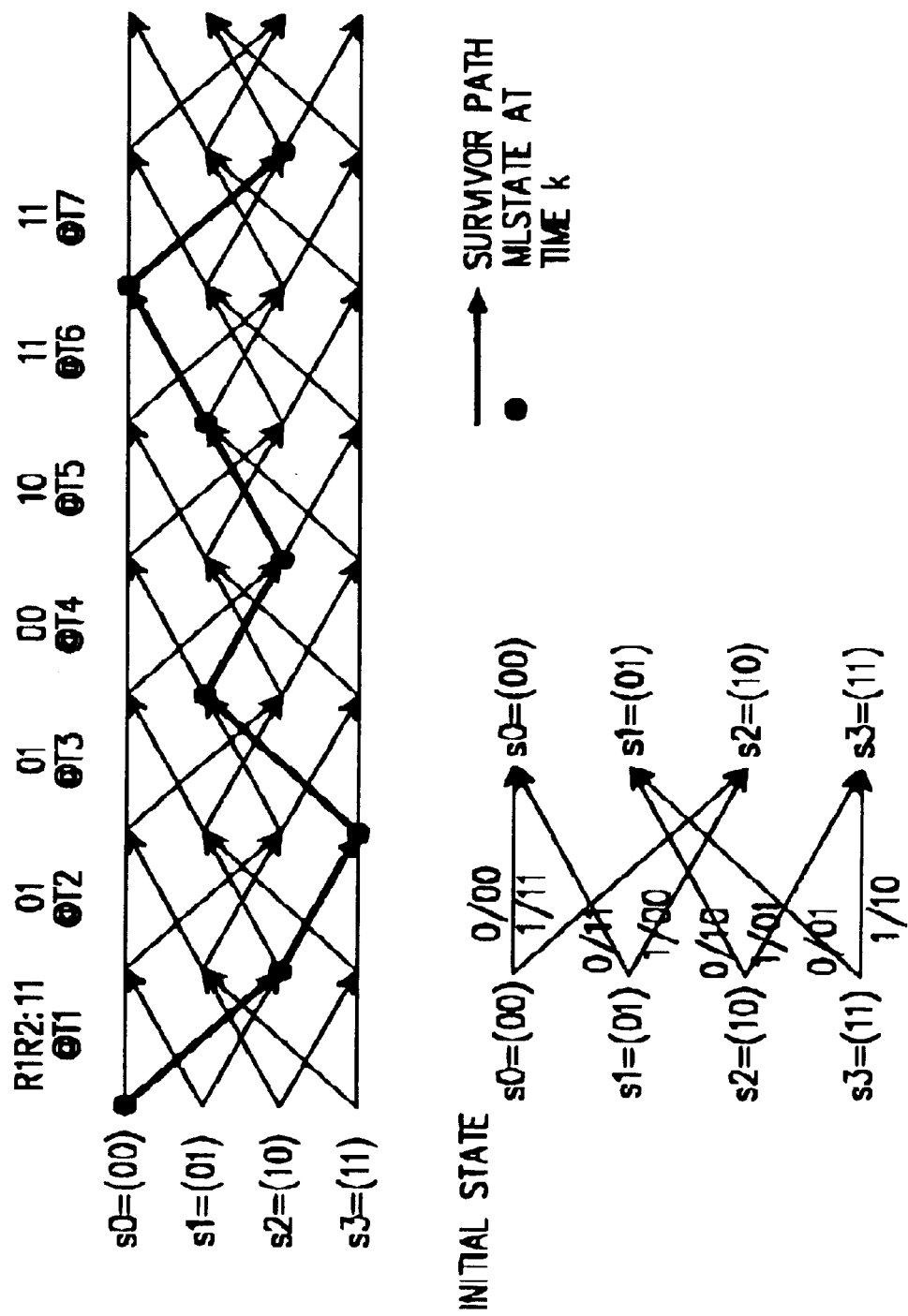
FIG. 4 is a trellis diagram of a constraint length K=2, coding rate R=1/2 encoder.

FIG. 4 shows a trellis diagram with a state number S=4 encoder. It is noted from FIG. 4 that ML state index information is {0,2,3,1,2,1,0,2 . . . }. Table 1 below shows ML state index information stored in the respective cells in the register exchange cell block having a connection according to the trellis structure of FIG. 4.

to (k−1) are '0000', '2222', '3333', '1111', '2222' and '1111', respectively, which are identical to the ML state sequence {0,2,3,1,2,1} in the trellis of FIG. 4. Therefore, when the ML state selecting operation is performed to some extent, it is possible to acquire the ML state index information at every cell update. That is, as compared with the existing trace-back method, it is possible to continuously acquire the ML state index information immediately after performing ML state selecting operation to some extent, thereby reducing the processing delay. In addition, when the ML state index information selecting operation is performed to some extent, the state values stored in the same column become identical, so that it is possible to output the ML state index information at any cell. If the index values stored in the same column are different, the state information having the major number will be output.

Figure 5:
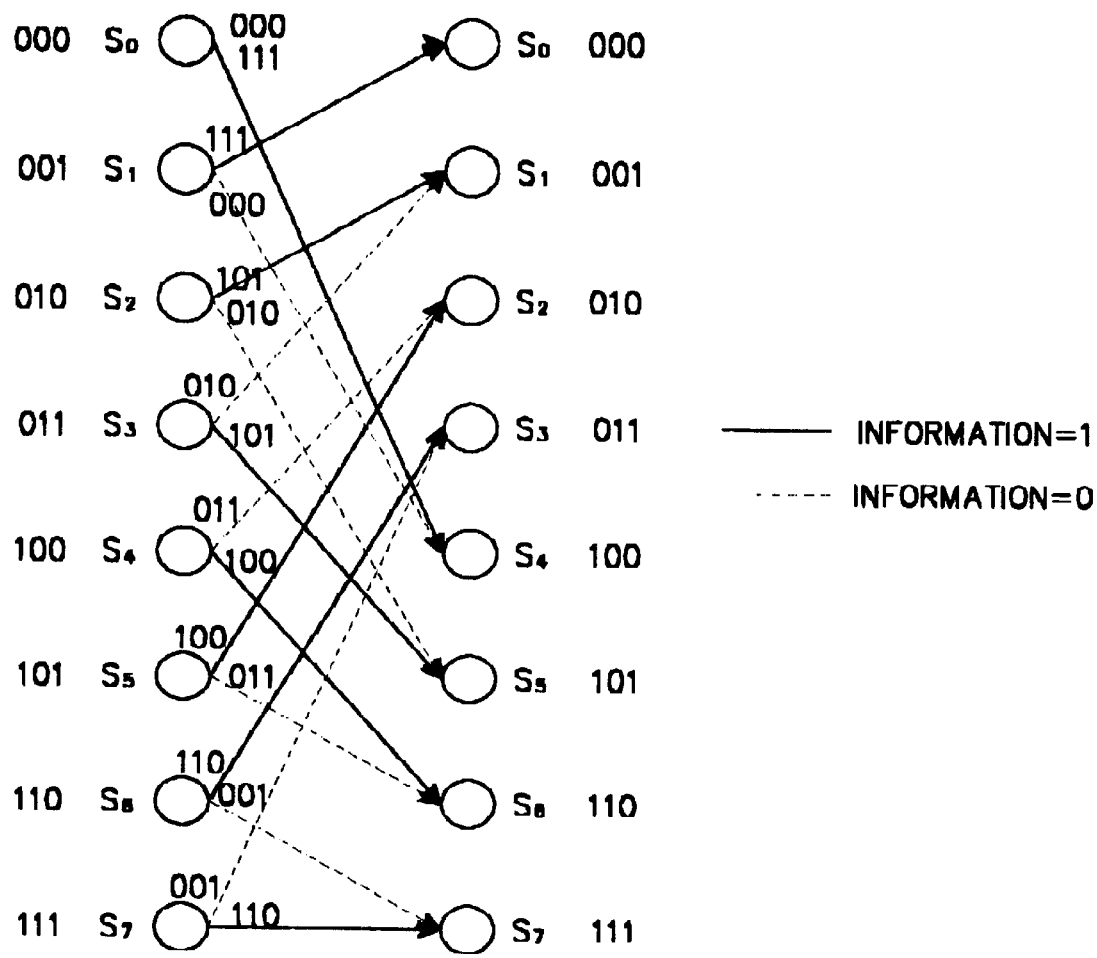
FIG. 5 is a trellis diagram of a K=4 turbo encoder used for an IMT-2000 air interface.

FIG. 5 shows a trellis diagram of a K=4 and a feedback generated polynomial of d(D)1+d^2+d^3 (the symbol "^" means a multiplication) turbo coder used for an IMT-2000 air interface. Referring to FIG. 5, since K=4, there exist 8 states in total, and since R=1/3, each branch outputs three symbols of C0, C1 and C2. In state 0 (S0; 000), for input information 0, a transition occurs to state 0 (S0; 000), and for input information 1, a transition occurs to state 4 (S4; 100). In state 1 (S; 001), for input information 0, a transition occurs to state 4 (S4; 100), and for input information 1, a transition occurs to state 0 (S0; 000). In state 2 (S2; 010), for input information 0, a transition occurs to state 5 (S5; 101), and for input information 1, a transition occurs to state 1 (S1; 001). In state 3 (S3; 011), for input information 0, a transition occurs to state 1 (S1; 001), and for input information 1, a transition occurs to state 5 (S5; 101). In state 4 (S4; 100), for input information 0, a transition occurs to state 2 (S2; 010), and for input information 1, a transition occurs to state 6 (S6; 110). In state 5 (S5; 101), for input information 0, a transition occurs to state 6 (S6; 110), and for input information 1, a transition occurs to state 3 (S3; 011). In state 6 (S6; 110), for input information 0, a transition occurs to state 7 (S7; 111), and for input information 1, a transition occurs to state 3 (S3; 011). In state 7 (S7; 111), for input information 0, a transition occurs to state 3 (S3; 011), and for input information 1, a transition occurs to state 7 (S7; 111).

Figure 6:
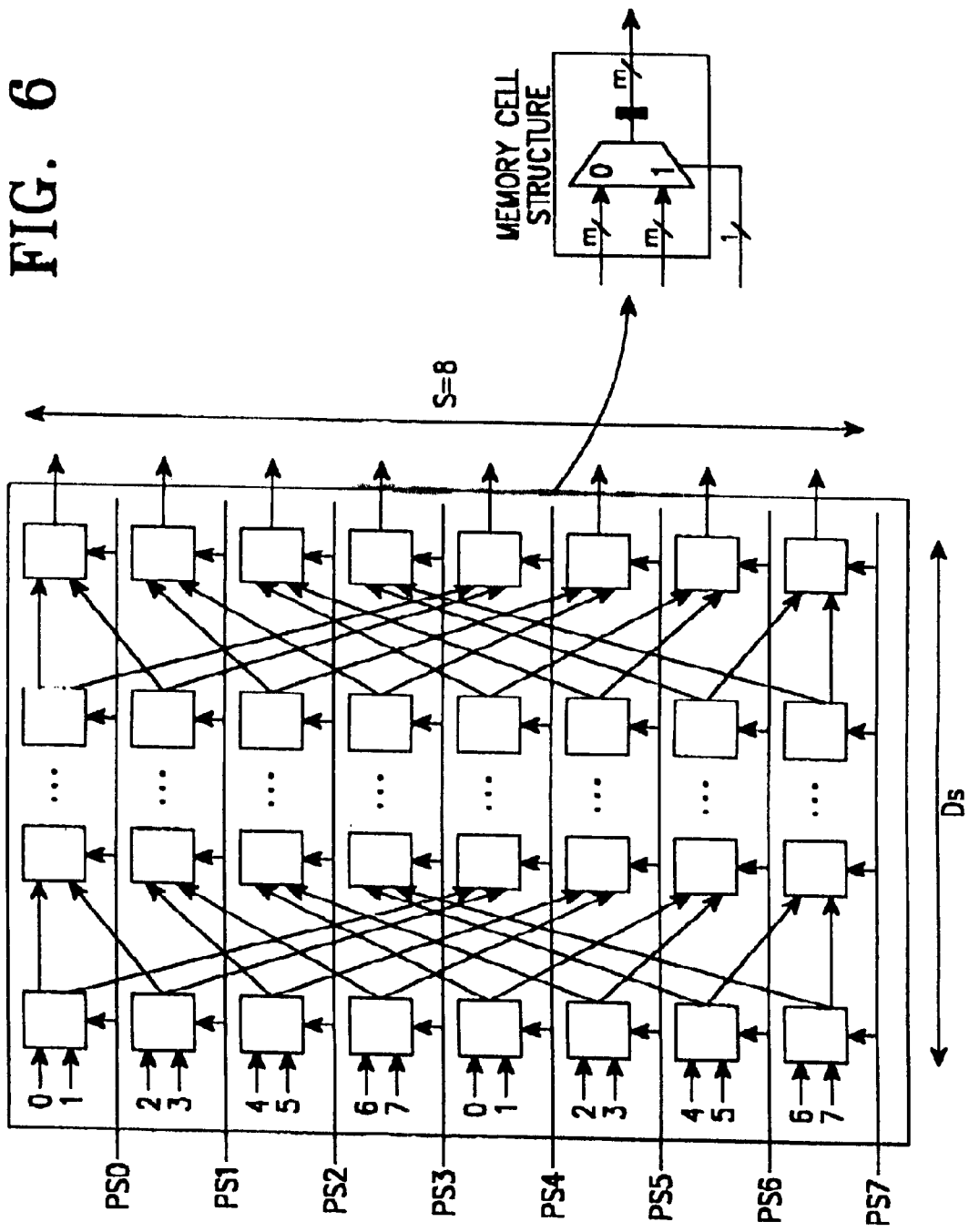
FIG. 6 is a diagram illustrating an ML state selector for a K=4 turbo encoder used for an IMT-2000 air interface according to an embodiment of the present invention.

FIG. 6 shows a structure of the register exchange cell block according to the trellis structure of FIG. 5. In FIG. 6, {1,2,3,4,5,6,7} input to the respective cells indicate the

TABLE 1

| Path Select Signal | 1000 | 0100 | 0100 | 0111 | 0000 | 1111 | 0000 | 0000 | 0111 | 1111 | 0000 |
|---|---|---|---|---|---|---|---|---|---|---|---|
| State | @T1 | @T2 | @T3 | @T4 | @T5 | @T6 | @T7 | @T8 | @T9 | @T10 | @T11 |
| k | 1202 | 0302 | 0302 | 0313 | 0202 | 1313 | 0202 | 0202 | 0313 | | |
| k-1 | | 1210 | 0200 | 0232 | 0101 | 2222 | 1111 | 0000 | 2222 | | |
| k-2 | | | 1011 | 0020 | 0303 | 1111 | 2222 | 1111 | 0000 | | |
| k-3 | | | | 1101 | 0202 | 3333 | 1111 | 2222 | 1111 | | |
| k-4 | | | | | 1010 | 2222 | 3333 | 1111 | 2222 | | |
| k-5 | | | | | | 0000 | 2222 | 3333 | 1111 | | |
| k-6 | | | | | | | 0000 | 2222 | 3333 | | |
| k-7 | | | | | | | | 0000 | 2222 | | |
| k-8 | | | | | | | | | 0000 | | |
| k-9 | | | | | | | | | | | |

In Table 1, for example, with regard to ML state index information stored in the respective cells at the time @T7, it is noted that an initial value '0202' is stored in a kth column and a state index value '1111' which is the previous ML state index information is stored in a (k−1)th column. That is, the state information stored in the time from (k−6)

states 0, 1, 2, 3, 4, 5, 6 and 7 in the trellis, and PS0–PS7 indicate the path select signals for selecting the rows, provided from the path selection block. The window size W (or Ds) is determined through experiments. The state information input to the respective cells in the first column is previously determined by the trellis. Further, the cells existing between the first column and the last column each are connected to two cells in the immediately preceding column so that they receive two state values according to the trellis structure. For example, each cell, except the first cell in the first row, is connected to an immediately preceding cell in the same row and the second cell in the second row of the immediately preceding column. It is not always the case that each cell receives two state values as shown in FIG. 6. That is, it is possible for each cell to receive two or more state values according to the characteristics of the encoder. When receiving two state values, each cell has a 2×1 multiplexer structure as illustrated, and selects one of the two received state values according to the path a select signal to provide the selected state value to the corresponding cell.

As described above, compared with the existing traceback ML state selecting method, the ML state selection method using the register exchange method according the present invention has no processing delay, making it suitable for a high-speed application. Therefore, the invention can be efficiently applied to ML state selection for a high-speed turbo decoder used for the IMT-2000 air interface.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A device for selecting an ML (Maximum Likelihood) state in a decoding device comprising:

a plurality of cells arranged in a matrix of rows and columns; and a plurality of select lines, wherein each select line is connected to all cells in a corresponding row, the select lines receiving associated path select signals, each cell in a column being connected to cells in an immediately preceding column so that the cell receives a plurality of state values according to a trellis structure of the decoding device, each cell in a first column receiving a plurality of state values determined according to a trellis structure of an encoder, said each first column cell selecting one of the received state values in response to the select signal to store the selected state value, and cells in a last column outputting a state value corresponding to the ML state.

2. The device as claimed in claim 1, wherein said each cell is comprised of an M×1 multiplexer.

3. The device as claimed in claim 1, wherein the state values stored in the cells in the same column become identical after a lapse of a predetermined time.

4. The device as claimed in claim 1, wherein when the state values output from the cells in the last column are different, a state value having a major number is determined as the ML state value.

5. The device as claimed in claim 1, wherein the path select signal is a signal for calculating a branch metric value in each state of the trellis of the encoder and for selecting a path using the calculated branch metric values and an immediately previous path metric value.

6. A device for selecting an ML state in a decoding device, comprising:

a path selection block for calculating a branch metric value for each branch in each state of a trellis determined by an encoder, and outputting path select signals for selecting a path using the calculated branch metric values and an immediately previous path metric value; and a register exchange cell block including a plurality of cells arranged in a matrix of rows and columns, and a plurality of select lines, wherein each select line is connected to all cells in a corresponding row, the select lines receiving associated path select signals, each cell in a column being connected to cells in an immediately preceding column so that the cell receives a plurality of state values according to a trellis structure of the decoding device, each cell in a first column receiving a plurality of state values determined according to a trellis structure of the encoder, said each first column cell selecting one of the received state values in response to the select signal to store the selected state value, and cells in a last column outputting a state value corresponding to the ML state.

7. The device as claimed in claim 6, wherein said each cell is comprised of an m×1 multiplexer.

8. The device as claimed in claim 6, wherein the state values stored in the cells in the same column become identical after a lapse of a predetermined time.

9. The device as claimed in claim 6, wherein when the state values output from the cells in the last column are different, a state value having a major number is determined as the ML state value.

10. A method for selecting an ML state in an ML state search device including a plurality of cells arranged in a matrix of rows and columns, and a plurality of select lines, wherein each select line is connected to all cells in a corresponding row, the select lines receiving associated path select signals, each cell in a column being connected to cells in an immediately preceding column so that the cell receiving a plurality of state values according to a trellis structure of the decoding device, and each cell in a first column receives a plurality of state values determined according to a trellis structure of an encoder, the method comprising the steps of:

calculating a branch metric value for each branch in each state of a trellis determined by the encoder, and providing path select signals for selecting a path using the calculated branch metric values and an immediately previous path metric value; and selecting, in each one of the plurality of cells, one of the received state values in response to the select signal to store the selected state value, and outputting the ML state value in cells in a last column.

11. The method as claimed in claim 10, wherein said each cell is comprised of an m×1 multiplexer.

12. The method as claimed in claim 10, wherein the state values stored in the cells in the same column become identical after a lapse of a predetermined time.

13. The method as claimed in claim 10, wherein when the state values output from the cells in the last column are different, a state value having a major number is determined as the ML state value.

* * * * *